United States Patent
Chen et al.

(10) Patent No.: US 7,984,410 B2
(45) Date of Patent: Jul. 19, 2011

(54) HIERARCHY-BASED ANALYTICAL PLACEMENT METHOD FOR AN INTEGRATED CIRCUIT

(75) Inventors: Tung-Chieh Chen, Taipei (TW); Che-Wei Jiang, Tainan (TW)

(73) Assignee: Springsoft USA, Inc., San Jose, CA (US)

( * ) Notice: Subject to any disclaimer, the term of this patent is extended or adjusted under 35 U.S.C. 154(b) by 408 days.

(21) Appl. No.: 12/168,288

(22) Filed: Jul. 7, 2008

(65) Prior Publication Data
US 2009/0031269 A1   Jan. 29, 2009

Related U.S. Application Data

(60) Provisional application No. 60/952,454, filed on Jul. 27, 2007.

(51) Int. Cl.
  G06F 17/50  (2006.01)
  G06F 9/455  (2006.01)
(52) U.S. Cl. ........ 716/119; 716/118; 716/122; 716/123; 716/124; 716/125; 716/132; 716/135
(58) Field of Classification Search .......... 716/118–119, 716/122–125, 132, 135
See application file for complete search history.

(56) References Cited

U.S. PATENT DOCUMENTS

| | | | |
|---|---|---|---|
| 6,282,693 B1 | 8/2001 | Naylor et al. | |
| 2003/0196183 A1* | 10/2003 | Alpert et al. | 716/10 |
| 2006/0190889 A1* | 8/2006 | Cong et al. | 716/8 |

* cited by examiner

Primary Examiner — Stacy A Whitmore

(57) ABSTRACT

A placer produces a global placement plan specifying positions of cell instances to be interconnected by nets within an integrated circuit (IC) by initially clusterizing cell instances to form a pyramidal hierarchy of blocks and generating an initial global placement plan specifying a position of each block at a highest level of the hierarchy. The placer then declusterizes the global placement plan by replacing the highest level blocks with their component blocks and then improves the routability of the global placement plan by iteratively moving specified block positions in directions and by distances dynamically determined by analyzing the global placement plan and an objective function having a total wirelength term and having a bin density term reflecting density of blocks in specified areas (bins) of the IC. The placer iteratively repeats the declusterization and routability improvement process until the global placement plan specifies positions of all blocks residing at the lowest level of the hierarchy, with weighting of the bin density term adjusted when necessary during each iteration of the routability improvement process to provide sufficient white space in each bin. The placer employs a look-ahead legalization technique to move low level blocks to legal positions during later iterations of the plan improvement process.

16 Claims, 7 Drawing Sheets

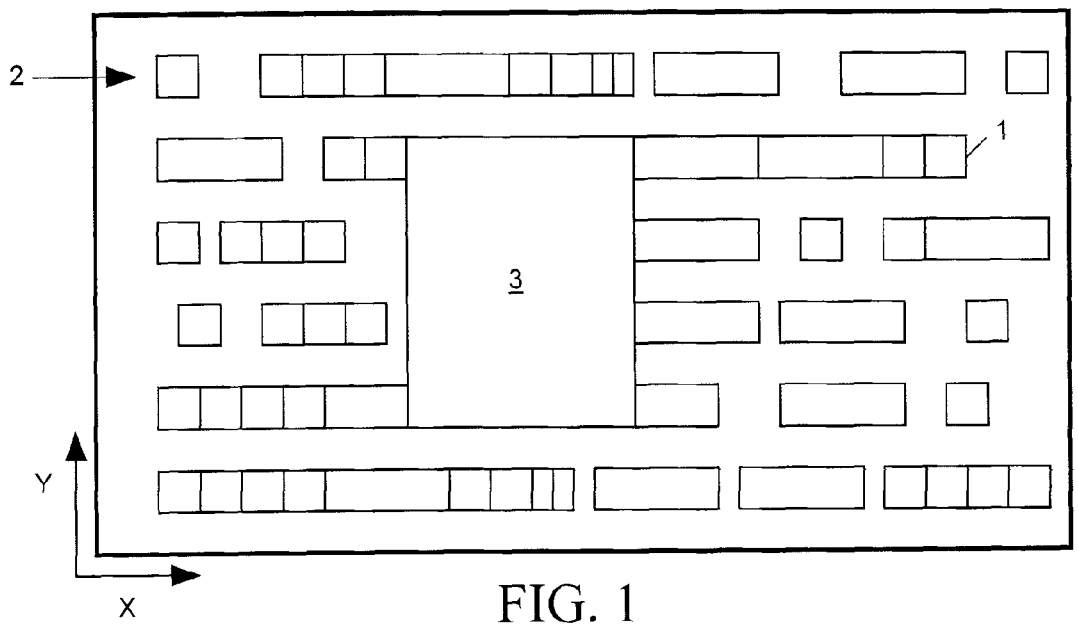
FIG. 1
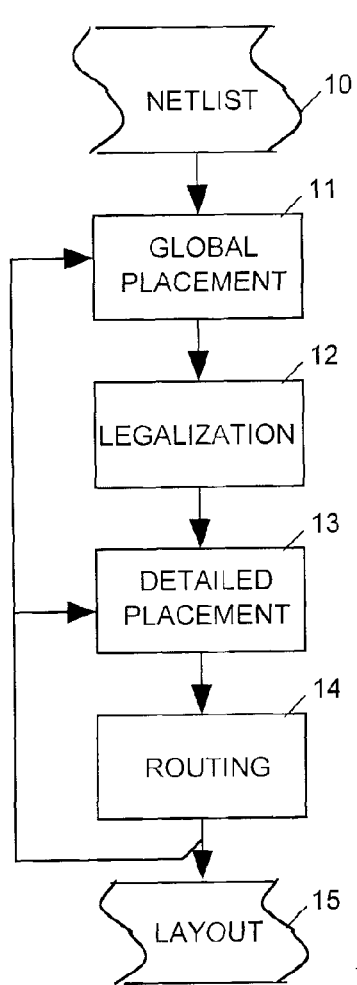
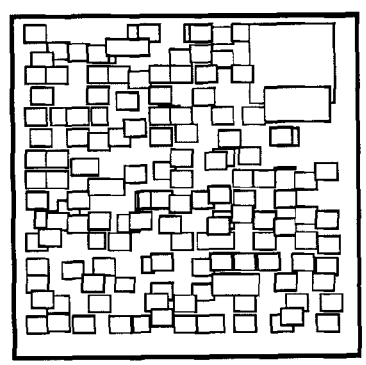
FIG. 3
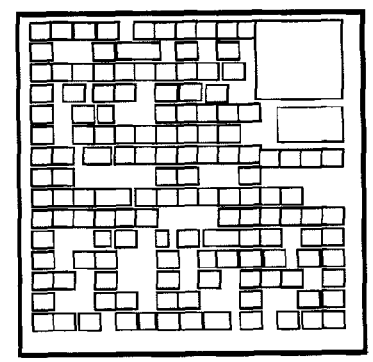
FIG. 4
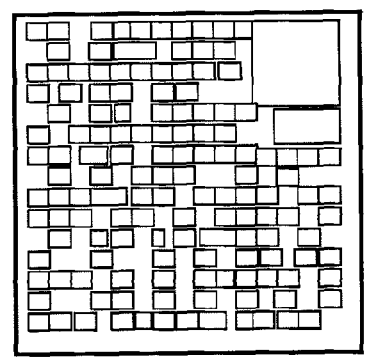
FIG. 2  FIG. 5

HIERARCHY-BASED ANALYTICAL PLACEMENT METHOD FOR AN INTEGRATED CIRCUIT

CROSS-REFERENCE TO RELATED APPLICATION

This application claims benefit of U.S. Provisional Application No. 60/952,454 filed Jul. 27, 2007, the entire disclosure of which is hereby incorporated herein by reference for all purposes.

BACKGROUND OF THE INVENTION

1. Field of the Invention

The invention relates in general to algorithms for generating a global placement plan for an integrated circuit, and in particular to an analytical placement algorithm that takes into account preplaced blocks, white space and legalization constraints.

2. Description of Related Art

An integrated circuit (IC) designer typically generates a text-based netlist describing an IC as a hierarchy of modules formed by instances of various components (cells) interconnected by signal paths (nets). The nets are formed by conductors residing on various horizontal layers of the IC and by conductive "vias" passing vertically between layers. Longer nets may include buffers when needed for amplifying signals they convey. A netlist is typically hierarchical in nature with cell instances being organized into low level modules and lower level modules being organized into higher level modules. Most cell instances are usually of standard height but varying width, however some cell instances may be large "intellectual property" (IP) modules implementing devices such as memories and microprocessors.

After creating the netlist, the designer employs a computer-aided placement and routing (P&R) tool to produce a global placement plan indicating a position for each cell instance, and to then produce a routing plan describing the routes and positions of conductors, vias and buffers forming the nets that connect the cell instances. When unable to develop a suitable routing plan, the P&R tool will modify the global placement plan and again attempt to develop a suitable routing plan.

Cell instances of standard height are normally aligned in non-overlapping positions in parallel rows. A cell instance is considered to be in a "legal position" if it is properly aligned in one of the rows. Global placement algorithms typically position cells to optimize routability, but they do not concern themselves with placing cells in legal positions and may allow some cell instances to overlap with each other. Therefore after producing a global placement plan, a P&R tool will "legalize" a global placement plan prior to generating a routing plan by moving cell instances to nearby legal positions. The P&R tool then adjusts the legalized placement plan to produce a detailed placement plan by swapping and shifting cell instance positions to reduce the lengths of nets needed to interconnect the cells and the congestion in any area. The P&R tool finally generates a routing plan based on the detailed placement plan.

The ability of a P&R tool to quickly generate a suitable layout depends largely on how well the global placement plan anticipates the routing requirements. When generating a global placement plan, a typical P&R tool will try to position highly-interconnected cell instances close to one another in order to reduce the total length of the nets (the "wirelength") needed to interconnect cell instances, but will also try to distribute the cells in a way that allows sufficient space for routing nets between cells. Thus a global placement plan should provide an adequate balance between positioning cell instances close to one another to reduce wirelength and positioning cell instances farther apart to distribute adequate space throughout the placement area for routing nets. Some P&R tools establish an objective (or "cost") function having cell instance coordinates as independent variables to quantify the routability of a global placement plan. The global placement plan for which the value of the objective function is lowest is considered most likely to be routable. A P&R tool may employ analytical placement algorithms to iteratively adjust the global placement plan, with the algorithm analyzing the global placement plan and the objective function after each iteration to determine how to reposition cells so as to improve the routability of the placement as indicated by the value of the objective function.

Objective functions typically include a term that increases with the estimated total wirelength because routing becomes more difficult as wirelengths increase. Since a global placement plan can also be unroutable even when wirelengths are short when the plan requires too many nets to pass through the same area of an IC, some "congestion-aware" analytical global placement plans add a routing congestion term to the objective function. A congestion aware placement algorithm divides an IC's placement area into regions and places cells within each region. A routing congestion term can be designed to increase the objective function value as the number of nets that must cross any region boundary increases, thereby discouraging the placement algorithm from generating a global placement plan resulting in excessive routing congestion in any region.

Since during the routing stage of the layout process, a P&R tool may have to add buffers as certain points within the layout to amplify signals passing over the longer nets, a global placement plan should distribute empty space ("white space") throughout the IC in order to accommodate buffers added to the layout during the routing phase. Although a congestion aware placement algorithm tends to distribute white space by spreading cell instances apart, it can still pack some regions too tightly to provide adequate white space for buffer insertions when no routing congestion occurs at the boundaries of those regions.

It is often necessary to place certain cell instances, such as analog blocks, memory blocks, and I/O buffers, in predetermined locations within an IC. Since such "preplaced blocks" act as constraints on positioning cell instances, including preplaced blocks in an IC design makes it more difficult for a placer to find a routable placement, particularly when preplaced blocks are large and numerous. Cells instances of widely varying size and shape can also make placement more difficult.

One drawback to prior art analytical global placement algorithms is that, while the global placement plans are produced with optimized routability as indicated by the objective function, such global placement plans may not be optimal after legalization since a legalization algorithm does not consider the objective function when repositioning cell instances to legal positions. Thus what is needed is an analytical placement algorithm to produce a global placement plan for mixed-size cell instances that optimizes post-legalization routability by minimizing total wirelength while taking into account preplaced block, white space and legalization constraints.

SUMMARY OF THE INVENTION

The invention relates to a method for generating a global placement plan specifying positions of cell instances to be interconnected by nets within an integrated circuit (IC).

The method makes use of an objective function using weighted wirelength and bin density terms to characterize the routability of a global placement plan. The wirelength term is a function of an estimated total wirelength of nets needed to interconnect cell instances forming blocks positioned in accordance with the global placement plan. Treating the IC as being divided into an array of bins, with each bin b having a specified maximum amount of available space $M_b$ for accommodating blocks, the density term is a function of the difference between areas of blocks specified by the global placement plan as residing within each bin b and $M_b$.

A placer employing the method initially clusterizes the cell instances to define a pyramidal hierarchy of blocks wherein each block residing at a lowest level of the hierarchy consists of a separate one of the cell instances, and wherein all blocks residing at each level of the hierarchy other than a highest level form blocks at a next higher level of the hierarchy such that at least one block residing at each level of the hierarchy comprises a plurality of component blocks residing at a next lower level of the hierarchy. The placer then generates an initial global placement plan including a position specification for each block residing at the highest level of the hierarchy, where the position specification for a block indicates a position within the IC for that block.

The placer then declusterizes the global placement plan by replacing a position specification for at least one block comprising a plurality of component blocks with a separate position specification for each of its component blocks. The placer then improves the routability of the global placement plan by repositioning blocks. To improve routability, the placer first initializes weighting of the wirelength and bin density terms of the objective function such that the wirelength term has a greater influence on the objective function value than the bin density term. The placer then iteratively analyzes the objective function and the global placement plan to determine distances and directions within the IC to move the specified positions of blocks so as to improve routability of the global placement plan, which is indicated by the value of the objective function, and then modifies the global placement plan accordingly. The iterative analysis and modification process continues until the placer maximizes the routability indicated by the value of the objective function. The placer then iteratively alters weighting of the objective function's wirelength and bin density terms to increase an influence on objective function value of the bin density term relative to an influence on objective function value of the wirelength term and repeats the iterative routability improvement process until each bin has at least a specified minimum amount of unoccupied space.

The placer iteratively repeats the declusterization and routability improvement process of the preceding paragraph until the global placement plan is fully declusterized. At that point, the placer performs a look-ahead legalization process wherein it iteratively modifies the global placement plan to legally position blocks and then repeats the routability improvement process until the objective function value for successive versions of the global placement plan converges.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like element

BRIEF DESCRIPTION OF THE DRAWINGS

FIG. 1 is a simplified plan view showing positions of cells within an IC.

FIG. 2 is a data flow diagram depicting a process for generating an IC layout.

FIGS. 3-5 are simplified graphical depictions of a succession of IC global placement plans generated by a placement and routing tool employing the process of FIG. 2.

DETAILED DESCRIPTION OF THE INVENTION

Figure 6:
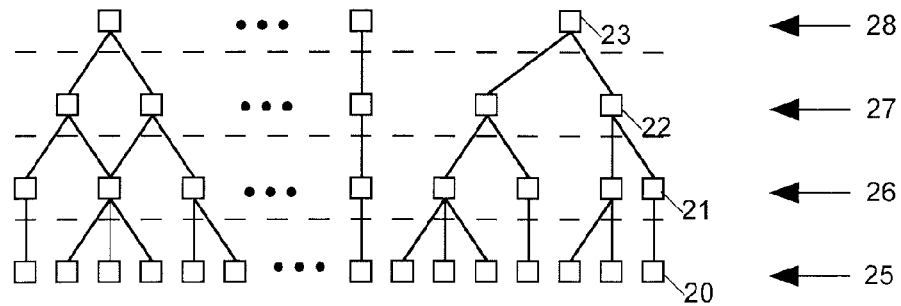
FIG. 6 is a graphical representation of a cell instance clustering process used by a global placement method in accordance with the invention.

The invention relates to a method for generating a global placement plan specifying approximate positions of cell instances within an integrated circuit (IC) to be fabricated. A netlist describes an IC as a set of cell instances having terminals interconnected by conductive networks ("nets"). A placement and routing (P&R) tool converts a netlist into an IC layout, a data file indicating a position within the IC of each cell instance and describing the physical arrangements of the conductors forming the nets. As illustrated in FIG. 1, cell instances 1 implementing small devices, such as transistors and logic gates, are of standard height in the y direction of the x-y plane of the IC surface and of varying width in the x direction, and they are normally laid out in non-overlapping positions along parallel rows 2 of the standard height. "Macro cells" 3 implementing larger devices such as memories and processors can span several rows. The spaces between rows 2 are reserved for routing conductors forming the nets that are to interconnect terminals of cell instances. Thus to be in a "legal" position a standard cell instance 1 or a macro cell instance 3 must have its top and bottom edges aligned along the top and bottom edges of rows 2. A placement algorithm is normally free to place most cell instances in any legal position but is often required to certain place certain "pre-placed cell instances", such as, for example, cell instances implementing the IC's I/O ports, in pre-determined positions.

As illustrated in FIG. 2, a P&R tool employing a global placement method in accordance with the invention initially processes the netlist 10 to create a global placement plan (step 11), selecting a position for each cell instance within the IC in a way that minimizes an objective function (also called a "cost function") that is a measure of the cost of the global placement plan with respect to its routability; the lower the cost of the global placement plan, the more likely it is to be routable. As discussed in detail below, the cost of a global placement plan indicated by the objective function increases with the total estimated length of the nets ("wirelength") needed to interconnect the cell instances because long nets require more space. Thus, to minimize the objective function, the placer tends to position highly interconnected cells near one another. However, the objective function value also increases when cells are too densely packed in any area to preserve adequate empty space ("white space") for the P&R tool to subsequently add buffers to the layout when needed to amplify signals conveyed on the nets. Thus the placer develops a global placement plan at step 11 that is a tradeoff between positioning highly interconnected cell instances close to one another to reduce wirelength, and spreading cell instances apart to preserve adequate white space throughout the layout.

FIG. 3 depicts a simplified global placement plan for an IC having a relatively small number of cells, though a typical IC can have a very much larger number of cells. In generating the global placement plan, the placer is not constrained to placing cell instances positions in legal positions aligned along rows, and cell instances may have overlaps. Therefore after generating the global placement plan at step 11, the P&R tool "legalizes" the global placement plan (step 12) by repositioning cell instances as necessary to eliminate cell instance overlaps and to properly align cells in rows. FIG. 4 shows a legalized version of the global placement plan of FIG. 3.

Referring again to FIG. 2, the P&R tool then modifies the legalized global placement plan to produce an improved detailed placement plan (step 13) by swapping cell instance positions when doing so helps reduce the lengths of nets needed to interconnect the cells, and by shifting cells when helpful to reduce congestion in any area, that can make routing difficult. FIG. 5 shows a detailed placement plan that is modified version of the legalized global placement plan of FIG. 4. The P&R tool then generates a routing plan (step 14) based on the detailed placement plan. If it is unable to successfully produce a routing plan for the detailed placement plan, the P&R tool may return to step 13 to modify the detailed placement plan or may return to step 11 to modify the global placement plan. If it can successfully route the detailed placement plan, the P&R tool incorporates the placement and routing plans into the final IC layout 15.

Multilevel Framework Global Placement

The invention relates in particular to a method for generating the global placement plan at step 11 of FIG. 1. FIG. 6 graphically depicts an initial "clustering" phase of the global placement process that the placer carries out before attempting to place any cell instances. During the clustering phase, the placer iteratively clusters cell instances to form a multiple level, pyramidal hierarchy of blocks comprising a lowest level 25 and other levels 26-28, wherein each block 20 residing at the lowest level of the hierarchy comprises exactly one cell instance, and each block 21-23 at higher levels 25-28 of the hierarchy comprises at least one component block residing at a next lower level of the hierarchy, such that blocks 23 at the highest level of the hierarchy 28 comprise all of the cell instances. The placer processes the netlist to determine which cell instances are the most highly interconnected and is biased toward clustering more highly interconnected cell instance into the same block, and toward equalizing the total area requirements of cell instances forming blocks at each level of the hierarchy. For simplicity, FIG. 6 depicts only a four-level block hierarchy, but a clustered block hierarchy may have more or less than four levels.

After creating the block hierarchy, the placer carries out an iterative decustering and placement operation as illustrated in FIGS. 7A-7F. Although in FIGS. 7A-7F blocks on each level of the hierarchy are for simplicity depicted as being of similar size and shape, in practice they will vary in size and shape depending on the nature of the cell instances that form them. The placer initially centers every block 23 at the highest level 28 of the hierarchy in the available IC placement area 24

Figure 7A:
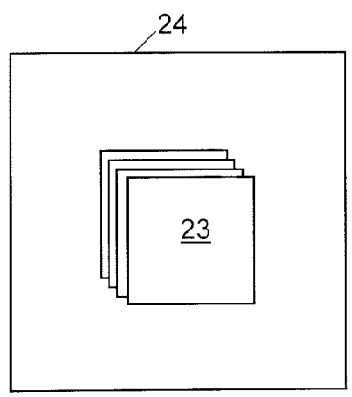
FIGS. 7A-7H graphically illustrate a succession of global placement plans generated in accordance with the present invention.
Figure 7B:
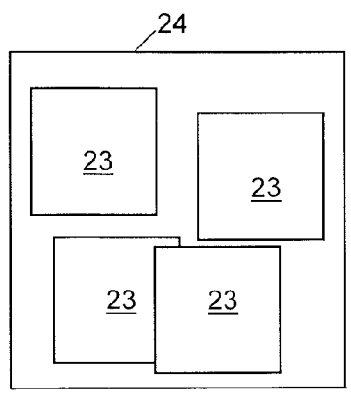

(FIG. 7A), and then moves blocks 23 away from one another as illustrated in FIG. 7B to positions that minimize an objective function (described in detail below) having the block positions as independent variables. The value of the objective function (the "cost" of the placement) is a measure of the routability of a placement in which all cell instances are placed in accordance with the blocks they form; the lower the cost the more likely that the placement will be routable.

Figure 7C:
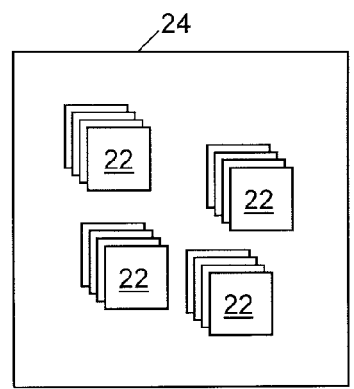
Figure 7D:
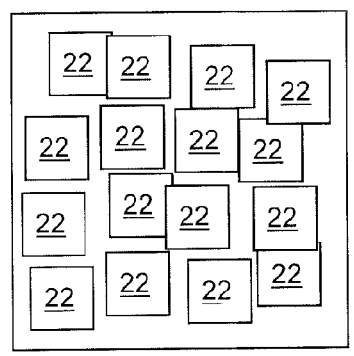
Figure 7E:
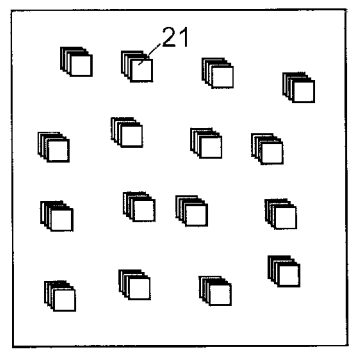
Figure 7F:
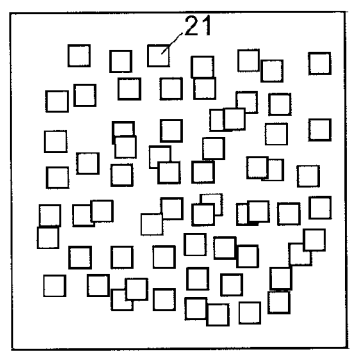
Figure 7G:
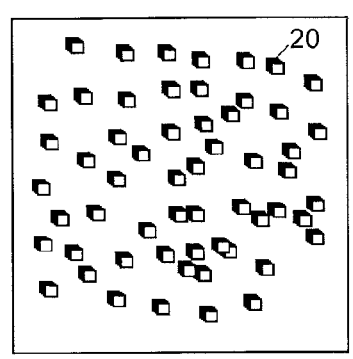
Figure 7H:
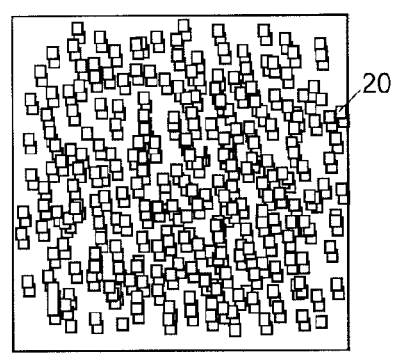

As shown in FIG. 7C, the placer then "de-clusterizes" each block 23 by replacing it with its constituent ("child") smaller blocks 22, with each child block 22 being initially centered on the point at which its parent block 23 had been centered. The placer then moves blocks 22 away from one another as illustrated in FIG. 7D to positions that minimize the objective function, which now has the positions of blocks 22 as independent variables. Thereafter (FIG. 7E), the placer de-clusterizes each block 22 by replacing it with its constituent child blocks 21 and then repositions blocks 21 as illustrated in FIG. 7F to positions that minimize the objective function. The process is repeated to declusterize blocks 21 into its constituent blocks (cell instances) 20 as shown in FIG. 7G, and to then reposition cell instances 20 as shown in FIG. 7H so as to minimize the objective function. The placement of FIG. 7H becomes the final global placement plan produced at step 11 of FIG. 2 that undergoes legalization at step 12.

Objective Function

As discussed above, whenever the placer declusterizes blocks into their children blocks, it initially centers each child block at the point at which its parent block was centered and then moves the children blocks to positions that best satisfy an objective function. The objective function is designed to enable the global placement solution to satisfy the following conditions:

Minimize $W(x,y)$

Subject to: $D'_b(x,y) < M_b$ for each bin b.

The term $W(x, y)$ is an estimated total wirelength $W(x, y)$ of all nets needed to interconnect the cell instances. The objective function treats the placement area as being divided into an array of rectangular areas ("bins"). The term $D'_b(x, y)$ is an estimated bin density of the $b^{th}$ bin, and $M_b$ is a maximum allowable bin density for the $b^{th}$ bin. As discussed below, the bin density $D'_b(x, y)$ of any bin b is a measure of the ratio of the total area of moveable blocks residing in bin b to the total available area within bin b for holding moveable blocks. Thus the placement solution to the objective function minimizes an estimated total wirelength $W(x, y)$ of all nets needed to interconnect the cell instances, subject to the constraints in which bin density $D'_b$ is less than the specified maximum bin density $M_b$ for each bin b. The bins are sized and $M_b$ is selected such that, if bin density is less than $M_b$, a global placement plan satisfying the above conditions will adequately distribute the white space among all bins.

The goals of minimizing the estimated total wirelength $W(x, y)$ and limiting the density $D_b'(x, y)$ of each bin b are a tradeoff since the placer tries to minimize wirelength by placing highly interconnected blocks together but tries to limit bin density by moving blocks apart. To characterize the quality of placement with respect to these two goals, the placer uses the following objective function which incorporates those competing objectives:

$$f(x, y) = \lambda_1 W(x, y) + \lambda_2 \sum_b (D'_b(x, y) - M_b)^2 \quad [1]$$

Weighting factors $\lambda_1$, $\lambda_2$ control the influence of bin density $D'_b$ relative to wirelength $W(x, y)$ with respect to the value of the objective function. If $\lambda_1 > 0$ and $\lambda_2 = 0$, the objective function value is minimized directly by minimizing wirelength without regard for cell density. When $\lambda_2$ is increasingly larger relative to $\lambda_1$, the minimum value of the objective function will occur when blocks are more evenly distributed throughout the placement area.

Wirelength Estimation

Figure 8:
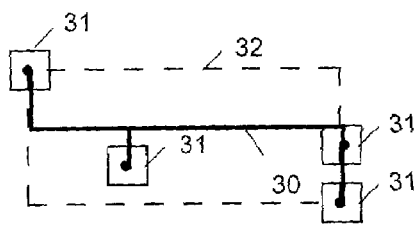
FIG. 8 is a simplified plan view of a set of cells interconnected by a net.

As mentioned above, the placer repositions blocks after each declusterizing iteration so as to minimize the value of an objective function having a term that increases with an estimated total wirelength $W(x, y)$ of the nets needed to interconnect the cell instances forming those blocks. Any of many known methods for estimating total wirelength can be employed. For example, a modified version of the "half perimeter wirelength" (HPWL) estimation method can be used. Referring to FIG. 8, since the conductors 30 forming a net interconnecting a set of blocks 31 are normally routed in orthogonal (X and Y) directions within the IC, a good estimate of the length of a net needed to connect terminals of two or more blocks is one half of the perimeter of a rectangle 32 having opposing corners at the centroids of the two most distant blocks to be interconnected by the net. The total wirelength $W(x, y)$ of all nets e needed to interconnect all cell instances v in an IC can be estimated as the sum of the HPWL of all nets $$W(x, y) = \sum_{\text{not } e} \left( \max_{v_i, v_j \in e} |x_i - x_j| + \max_{v_i, v_j \in e} |y_i - y_j| \right) \quad [2]$$

where $\max|x_i - x_j|$ and $\max|y_i - y_j|$ are the maximum distances in the x and y directions between the blocks to be interconnected by net e.

While the HPWL method for estimating wirelengths is sufficiently accurate, as described below, the method the placer uses to determine how to reposition cells after each declusterizing iteration to minimize the value of the objective function requires that the objective function be differentiable. Although the expression for $W(x, y)$ above is not differentiable, it is piece-wise linear differentiable and could be used as a measure of total wirelength $W(x,y)$ in the objective function expression [1] above provided that the derivative of the objective function is computed as its a piecewise linear derivative.

Alternatively the objective function can employ the following "log-sum-exp" wirelength model, which is a smoothed, differentiable approximation of the HPWL wirelength model of equation [2]:

$$W(x, y) = \gamma \sum_{e \in E} \begin{pmatrix} \log \sum_{v_k \in e} \exp(x_k/\gamma) + \log \sum_{v_k \in e} \exp(-x_k/\gamma) + \\ \log \sum_{v_k \in e} \exp(y_k/\gamma) + \log \sum_{v_k \in e} \exp(-y_k/\gamma) \end{pmatrix}, \quad [3]$$

As smoothing factor $\gamma$ approaches zero, the log-sum-exp model of equation [3] more closely approximates the HPWL model of equation [2].

The differentiable "LP-norm" wirelength model below can also be used in the objective function expression [1] above as a measure of total wirelength $W(x, y)$ of all nets e interconnecting blocks k positioned at coordinates $(x_k, y_k)$ $$W(x, y) = \left( \sum_{v_k \in e} (x_k)^p \right)^{\frac{1}{p}} - M_x + \left( \sum_{v_k \in e} (M_x - x_k)^p \right)^{\frac{1}{p}} + \left( \sum_{v_k \in e} (y_i)^p \right)^{\frac{1}{p}} - M_y + \left( \sum_{v_k \in e} (M_y - y_i)^p \right)^{\frac{1}{p}}$$

wherein p is a constant,
wherein all blocks k have coordinates $x_k > 0$ and $y_k > 0$,
wherein $M_x$ is any constant larger than $\max(x_k)$ for all blocks k, and
wherein $M_y$ is any constant larger than $\max(y_k)$ for all blocks k.

Bin Density

Figure 9:
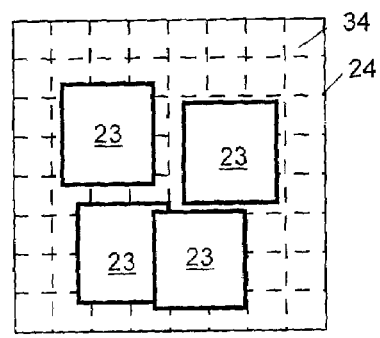
FIG. 9 is a simplified plan view of a set of blocks positioned within an IC placement area.

In addition to minimizing wirelength, a global placement plan should provide sufficient unoccupied "white space" throughout the placement area to accommodate buffers that the P&R tool may add to the layout when subsequently developing a routing plan when the buffers are needed to amplify signals conveyed on long nets. A P&R tool may also use white space following placement when necessary to change the size or shape of a cell instances. As illustrated in FIG. 9, the placer improves the likelihood that there will be adequate white space throughout the IC by dividing the placement area 24 into a set of rectangular "bins" 34 and then distributing the blocks 23 so that the "bin density" $D_b(x, y)$, the percentage of the bin occupied by moveable cells does not exceed a predetermined a maximum allowable bin density $M_b$ for that bin. Bin density may, for example, be computed as follows:

$$D_b(x, y) = \sum_{v \in V} P_x(b, v) P_y(b, v)$$

where $P_x(b, v)$ and $P_y(b, v)$ are overlap functions between any block v bin b in the x and y directions. The maximum allowable bin density $M_b$ for any bin b may, for example, be computed as $$M_b = t_{density}(w_b h_b - P_b)$$

where
 $t_{density}$ is a user-specified target density for each bin,
 $w_b$, $h_b$ are the width and height of bin b, and
 $P_b$ is the total area of block b reserved for preplaced blocks.

Although the placer is free to move most blocks within an IC layout, it may be constrained to placing certain "preplaced blocks" such as, for example cell instances forming an IC's input/output ports, at predetermined positions within the layout. The placer therefore computes the maximum allowable bin density $M_b$ for any bin b as a percentage ($t_{density}$) of the difference between the total area of the bin ($w_b h_b$) and any area of the bin $P_b$ needed to accommodate as the area of that bin not occupied by a preplaced block that is available for accommodating preplaced blocks. Note that if a bin is completely filled by a preplaced block, then maximum allowable bin density $M_b$ for that bin will be 0. The target density $t_{density}$ is chosen to be sufficiently large that when $D_b(x, y) < M_b$ for all bins b, the global placement plan will provide an adequate amount of white space in each bin.

A term involving the difference $D_b(x, y)-M_b$ between actual bin density and the maximum allowable bin density could therefore be included in objective function the placer evaluates when determining the cost of each successive placement. However, since $D_b(x, y)$ is not differentiable, and since the method the placer uses to determine how to position blocks to minimize the objective function requires that the objective function be differentiable, the following differentiable approximation of $D_b(x, y)$ can be used in the objective function.

$$D'_b(x, y) = \sum_{v \in V} c_v p_x(b, v) p_y(b, v),$$

where $$p_x(b, v) = \begin{cases} 1 - ad_x^2, & 0 \le d_x \le w_v/2 + w_b \\ b(d_x - w_v/2 - 2w_b)^2, & w_v/2 + w_b \le d_x \le w_v/2 + 2w_b \\ 0, & w_v/2 + 2w_b \le d_x, \end{cases}$$

$$a=4/((w_v+2w_b)(w_v+4w_b)),$$

$$b=2/(w_b(w_v+4w_b)),$$

$d_x$, $d_y$ are the x and y direction distances between the position of the center of block v and the center of bin b, $w_b$ is the width of bin b.

$w_v$ is the width of block v, and $c_v$ is a normalization factor selected such that the total potential of a block equals its area.

Conjugate Gradient Search with Dynamic Step Size

Several methods for determining placements that can minimize an objective function are known in the art and can be employed in alternative versions of the invention. A placer in accordance with a preferred embodiment of the invention searches for the lowest cost solution by iteratively modifying an initial, higher cost global placement plan using a modified version of the well-known conjugate gradient method to determine both a direction vector $d_i$ and a distance scalar ("step size") $\alpha_i$ in which to move each moveable block during each $i^{th}$ placement iteration that is most likely to reduce the objective function value. The direction vector $d_i$ separately indicates the direction in which to move each moveable block while scalar step size $\alpha_i$ indicates the distance every moveable block is to move in the indicated direction. The improved conjugate gradient method employed in the present invention dynamically decreases the step size for successive placement iterations as the global placement plan converges on its lowest cost solution.

Figure 10:
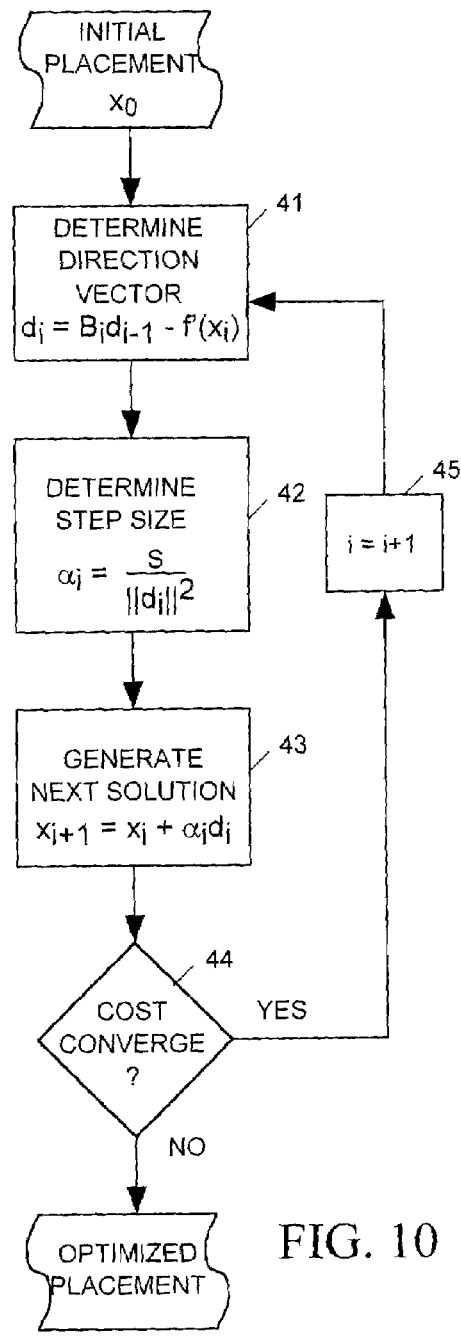
FIG. 10 is a data flow diagram illustrating a modified conjugate gradient method for optimizing a global placement plan.

FIG. 10 is a data flow diagram illustrating the modified conjugate gradient method used to refine the placement each time it declusterizes one or more blocks. The placer analyzes the initial declusterized placement $x_0$ to determine a direction vector $d_i$ indicating a direction in which to move each moveable block within the initial placement that will reduce the value of the objective function (step 41). The direction vector can be computed as $$d_i = B_i d_{i-1} - f'(x_i)$$

where $-f'(x_i)$ is the negative derivative of the objective function, and $B_i$ is the well-known Polak-Ribiere parameter:

$$B_i = \frac{\Delta x_i^T (\Delta x_i - \Delta x_{i-1})}{\Delta x_{i-1}^T \Delta x_{i-1}}$$

where $\Delta$ is the gradient function.

The placer also determines step size $\alpha_i$ at step 42. If the step size is too large, the placement solution will be too low in quality, but if the step size is small, the placer will take too long to arrive at a final solution. Therefore the placer dynamically adjusts the step size for each iteration so that it grows smaller as the placement approaches its lowest cost solution. One way to do that is to compute $\alpha_i$ for each iteration as the average Euclidean movement of all cells as a user-provided fixed value s:

$$\alpha_i = \frac{s}{\|d_i\|^2}$$

Larger step sizes used during the early placement iterations help reduce the time the placer needs to approach the lowest cost solution while the smaller step sizes used during the later iterations allow the placer to more accurately determine the lowest cost solution.

Having determined the direction vector $d_i$ and step size $\alpha_i$ indicating the direction and distance to move each moveable block, the placer then (step 43) generates a next placement solution by repositioning the moveable blocks in the indicated directions by the indicated distance in accordance with the expression $$x_{i+1} = x_i + \alpha_i d_i$$

The placer then evaluates the objective function with respect to placement solution $x_{i+1}$ to determine its cost and compares that cost to the cost of the preceding placement solution $x_i$ (step 44). If the cost of the global placement $x_{i+1}$ is not sufficiently close to the cost of the placement $x_i$, the placer increments i (step 45) and repeats steps 41-44 to modify global placement $x_{i+1}$ to produce a next global placement $x_{i+2}$. The placer continues to iteratively modify the global placement at the current level of declusterization until the value of the objective function for successive placements substantially converge.

Global Placement Algorithm

Figure 11:
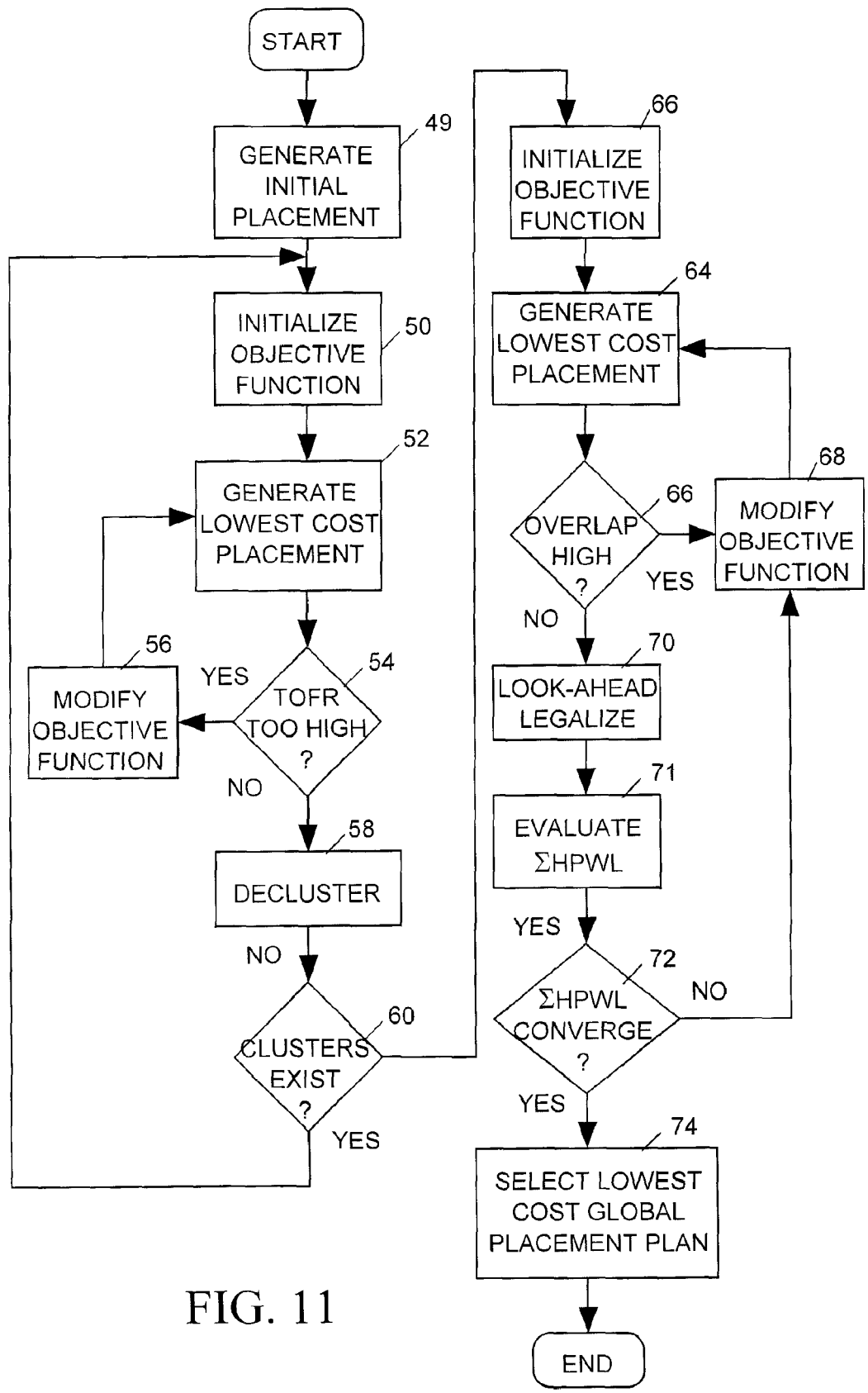
FIG. 11 is a dataflow diagram depicting the global placement step of FIG. 2 in more detail.

FIG. 11 is a dataflow diagram depicting global placement step 11 of FIG. 1 in more detail. The placer first generates an initial placement (step 49) by centering all blocks at the highest level of the clusterization hierarchy in the IC placement area. After initializing the objective function (equation [1] above) to set weighting factors $\lambda_1$ and $\lambda_2$ such that bin density has little or no influence on the objective function value compared to wirelength (step 50), the placer uses the modified conjugate gradient method described above to generate a low cost placement solution (step 52). The placer then (step 54) checks that placement solution to determine whether blocks are too concentrated in any area to provide an adequate amount of white space. The placer does this by computing an overflow ratio ($OFR_b$) for each bin b, summing $OFR_b$ for all bins to determine a total overflow ratio (TOFR) and determining whether TOFR for any bin is higher than a user-defined value, which by default is 0. The $OFR_b$ of any bin is defined as:

$OFR_b$=max(0,Occupied_Area−Available_Area)/Available_Area)

and TOFR for all bins is defined as:

$$TOFR = \sum_b OFR_b \text{ for all bins}$$

where the "Occupied_Area" is the area occupied by moveable blocks within the bin, and the "Available_Area" is the area of the bin not occupied by pre-placed blocks that is available for accommodating moveable blocks. Note that $OFR_b$ for any bin b will be greater than 0 if its available space for moveable blocks is smaller than the space required by the moveable blocks within the bin.

If the placer finds TOFR is too high at step 54, it redefines the objective function (step 56) by increasing the value of $\lambda_2$ relative to $\lambda_1$ so that bin density is of increased importance relative to wirelength. The placer then uses the conjugate gradient method to modify the last global placement solution to generate a new global placement solution (step 52) and again checks the TOFR to determine whether the place provides sufficient white space in each bin. The placer continues to loop through steps 52-56, progressively increasing $\lambda_2$ relative to $\lambda_1$ at step 56 with each iteration until it determines at step 54 that TOFR is sufficiently low for all bins to provide adequate white space in every bin. At that point, the placer declusters one or more of the larger blocks by replacing those blocks with their children blocks, with each child block being centered on the former position of its parent blocks (step 58). If it has not yet fully declustered all blocks (step 58), the placer returns to step 50 to re-initialize the objective function by again setting $\lambda_2$ low in relation to $\lambda_1$. The placer then again uses the modified conjugate gradient method to adjust the declustered global placement plan to generate a next global placement plan (step 52) The placer iteratively repeats steps 52-56 to arrive at a global placement solution for the current level of clusterization for which TOFR is sufficiently low, and then again declusters one or more of the largest remaining cluster blocks at step 58. If the placement is not yet fully declusterized (step 80), the placer iteratively repeats steps 50-60 progressively declustering and refining the global placement solution until at step 60 it determines it has fully declustered the placement.

Final Spreading with Look-Ahead Legalization

At this point the global placement plan indicates a position for each block at the lowest level of the block hierarchy and since each block at that level consists of only a single cell instance, the placement plan specifies a position for each cell instance. The placer now checks to see whether the amount of cell overlap is too high (step 66). The placer considers the amount of cell overlap to be too high when the total amount of overlapped block area is greater than a predetermined minimum percentage (for example 10%) of the total area of all blocks. If so, the placer sets $\lambda_2$ higher relative to $\lambda_1$ (step 66) and then generates a next low cost global placement (step 64) using the above described modified conjugate gradient method. The placer continues to loop through steps 64-68, increasing $\lambda_2$ relative to $\lambda_1$ at each pass through step 68 until it determines at step 66 that the percentage of block overlap is sufficiently low. At that point the placer subjects the global placement plan to "look-ahead legalization" (step 70).

Although cell instances in a legal placement plan should be aligned in parallel rows without overlapping one another, the placer allows cell instances in the global placement plan to overlap and does not necessarily place them in legal positions within such rows. Thus the legalization step 12 of FIG. 1 is carried out to modify the global placement plan by moving cell instances as necessary to align them into rows, to eliminate overlaps and to otherwise ensure that every cell instance resides in a legal position satisfying all placement constraints. The placer defers full legalization until after producing the global placement plan because full legalization can be too time-consuming to be performed on each iterative version of the global placement plan. One drawback to deferring legalization is that the lowest cost (most routable) pre-legalization global placement plan may not lead to the lowest cost post-legalization global placement plan. To resolve this problem, the placer performs "look-ahead legalization" at step 70 to legalize positions of the larger once it has produced a fully declustered the global placement plan in which each block is now a single cell instance and in which the total percentage of block overlap is less than a predetermined maximum. Since repositioning large cell instances is normally the most disruptive aspect of legalization with respect to altering the routability cost of the layout, the placer legalizes only relatively large blocks during the look-ahead legalization process (step 70). In particular, a block is subjected to look-ahead legalization only when its height or width is larger than a predefined minimum height $h_{min}$ in the y direction or width $w_{min}$ in the x direction. Since legalizing small cell instances is time consuming and normally has relatively little effect on global placement cost, the placer keeps small cell instances of height less than $h_{min}$ and width less than $w_{min}$ in their original positions during look-ahead legalization (step 70) and allows them to overlap.

After performing look-ahead legalization at step 70, the placer re-evaluates ΣHPWL (the sum of all wirelengths) at step 71. The placer iteratively repeats steps 64-72 evaluating ΣHWPL after each iteration (step 71) until it determines at step 72 that ΣHWPL for the last two successive look-ahead legalized global placements converge by differing by no more than a predetermined maximum amount. The placer then (step 74) selects from the sequence of previously generated look-ahead legalized global placement plans the plan having the lowest ΣHWPL to be the subject of full legalization at step 12 of FIG. 1

Figure 12:
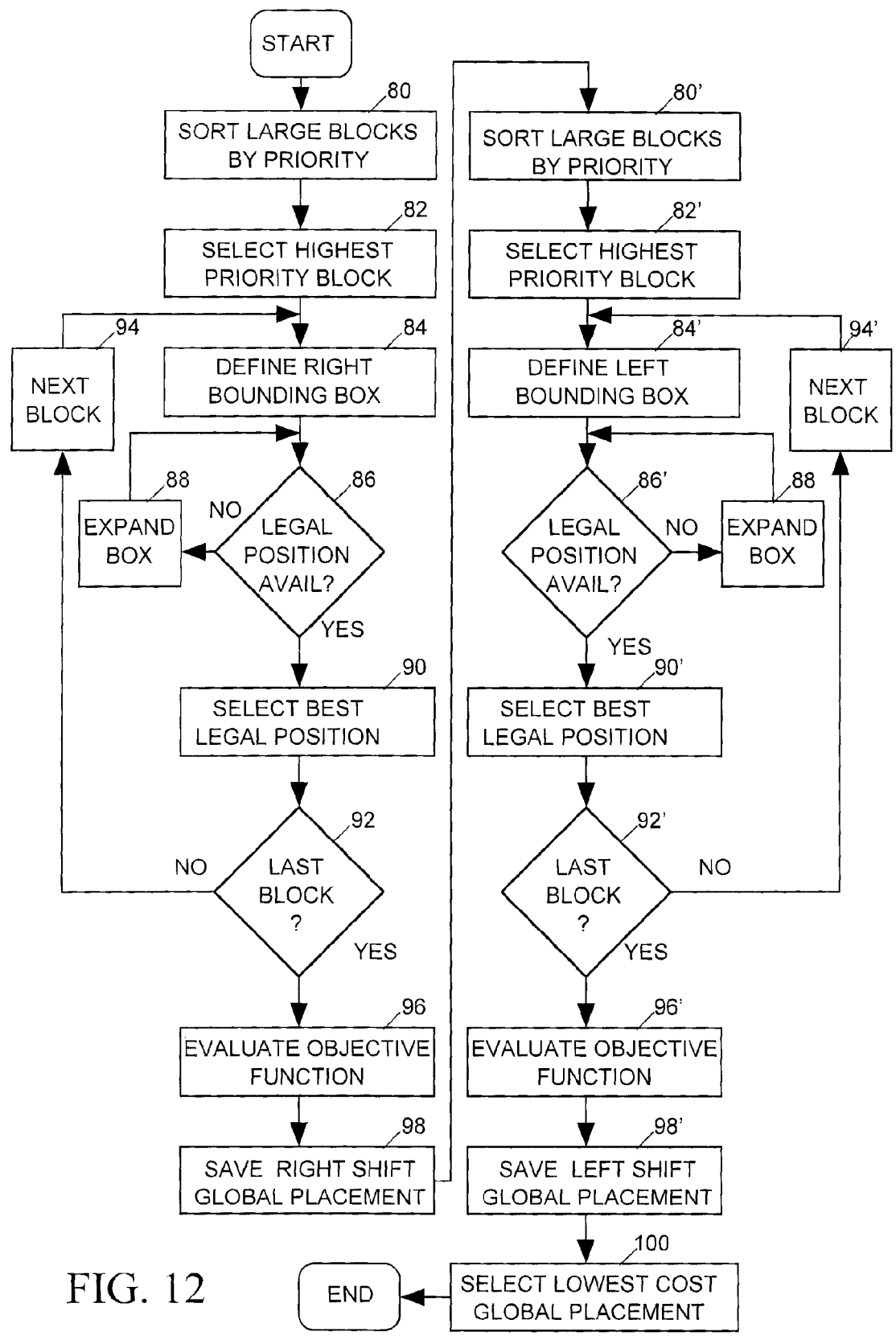
FIG. 12 is a data flow diagram depicting the legalization step of FIG. 11 in more detail.

FIG. 12 illustrates the look-ahead legalization step 70 of FIG. 11 in more detail. To carry out look-ahead legalization, the placer first (step 80) sorts all larger blocks of height greater than $h_{min}$ or width greater than $w_{min}$ to be look-ahead legalized according to their x-coordinates, width and height and assigns each $i^{th}$ bock a priority as follows $$\text{Priority}_i = k_1 x_i + k_2 w_i + k_3 h_i,$$

where
  $x_i$=the x coordinate of block i
  $w_i$=the width of block i
  $h_i$=the height of block I,
  $k_1$=weighting factor determined by the $i^{th}$ block's x coordinate rank,
  $k_2$=weighting factor determined by the $i^{th}$ block's width rank, and
  $k_3$=weighting factor determined by the $i^{th}$ block's height rank.

Figure 13:
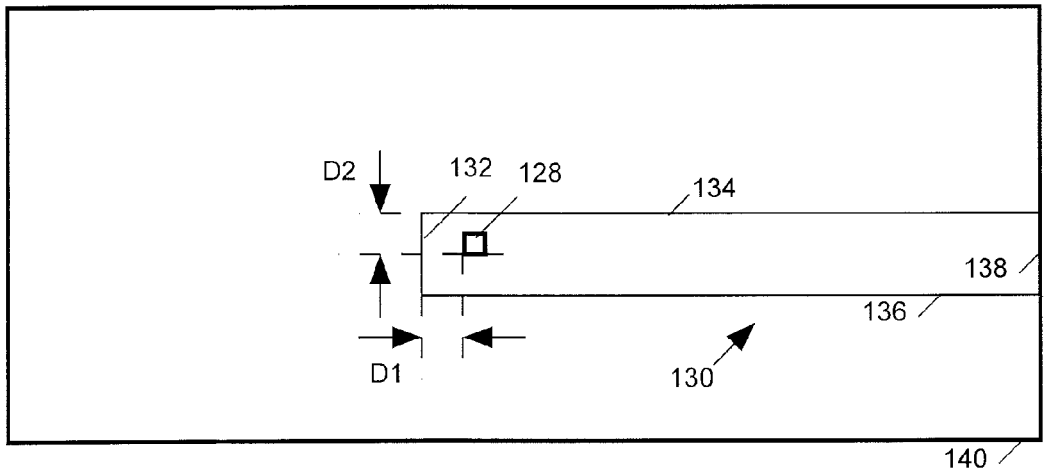
FIGS. 13-15 are simplified plan views of an IC layout illustrating the legalization process of FIG. 12.

Larger blocks and blocks positioned more to the left side of the placement area are given higher priority by setting $k_1$<0. The placer then selects the highest priority block (step 82) and defines a "left bounding box" 130 surrounding that block 128 as illustrated in FIG. 13 (step 84). The left side 132 of bounding box is selected to be a distance D1 from the left edge of block 128 wherein D1 is the average width of all cell instances. The upper side 134 and lower side 136 of bounding box 130 are each a vertical distance D2 (in number of rows) from the bottom edge of the block 128 where, for example, D2 may be computed as:

$$D2=\max(10,0.05*(\text{max\_cell\_height})/\text{row\_height})).$$

where
> max_cell_height=maximum height of any cell instance, and
> row_height=the height of a single row.

The right side of bounding box 130 is aligned with the rightmost edge of the IC placement area 140. D2 has dimensions in number of rows.

Figure 14:
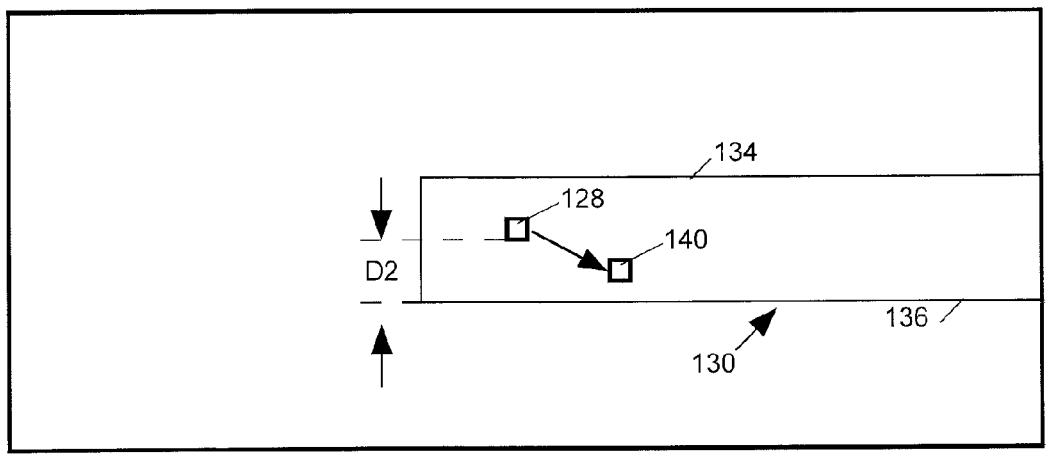

After defining the bounding box 130 around the selected block 128 at step 84, the placer determines whether there exists within that bounding box at least one legal position for that block (step 86) that does not overlap any other block. If no legal position is available within bounding box 130, the placer expands the bounding box vertically as shown in FIG. 14 by increasing the distance D2 between the bottom edge of block 128 and the top and bottom edges of bounding box 130. The placer continues to iterate though steps 86 and 88 until the bounding box is found to contain at least one legal position for block 128 (step 86). At that point the placer moves block 128 to the best legal position 140 (FIG. 14) within bounding box 130 such that the block move produces the least increase (or most decrease) in wirelength or other cost metrics (step 90).

If the selected block is not the last block to be look-ahead legalized (step 92), the placer selects the next highest priority block (step 94) and then repeats steps 84-90 to find a legal position for that block. The placer continues to iterate through step 84-92 until at step 92 it determines that it has pre-legalized all blocks. At that point the place evaluates the objective function for the resulting global placement (step 96) and then stores that placement (step 98).

Figure 15:
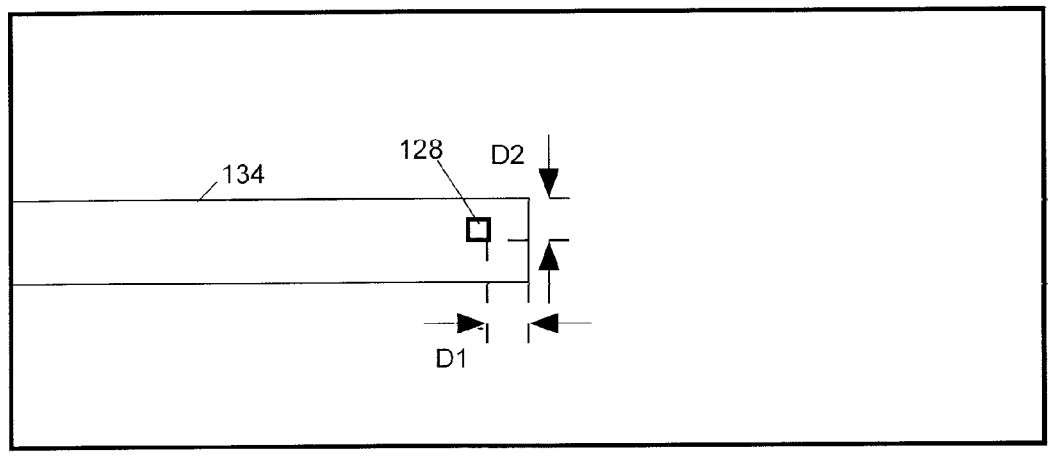

As discussed above, the "right shift" global placement was created by moving each large cell to a legal position that is generally to the right of its initial position. At steps 80' through 98', the placer carries out a look-ahead legalization process on the original global placement that is generally similar to the process carried out at steps 80-98 except that in step 80, blocks to the right are given higher priority than blocks to the left and in step 84' the bounding box 134, as shown in FIG. 15, is initially defined to extend from the left edge of the placement area to a distance D1 to the right of the right edge of the selected block 128. Thus at step 98', the placer will save a look-ahead legalized global placement that it created by moving each large cell to a legal position that is generally to the left of its initial position. At step 100, the placer selects the lowest cost one of the right shift and left shift look-ahead legalized placement as the output global placement of the look-ahead legalization step 70 of FIG. 11.

Figure 16:
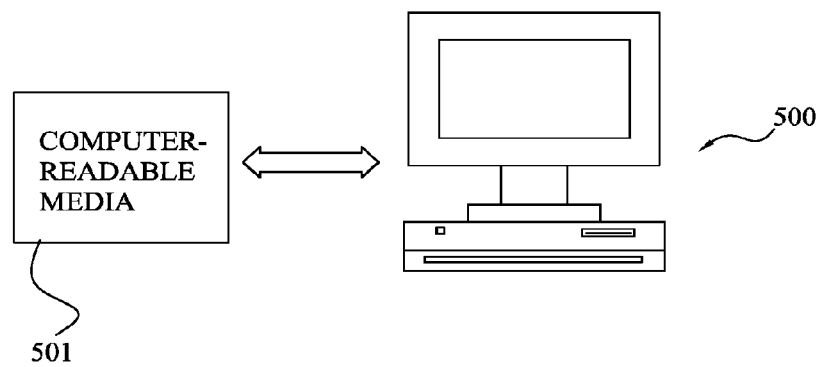
FIG. 16 is an exemplary diagram of conventional computer of the present invention.

The method is suitably implemented by a conventional computer 500 executing software residing on computer-readable media 501 such as, for example, a hard disk, a compact disk, or read only or random access memory, which when read and executed by a conventional computer, causes the computer to carry out the method. FIG. 16 is an exemplary diagram of conventional computer 500 in an implementation consistent with the principles of the invention.

Although there are many ways to practice the invention defined by the claims appended to this specification, the above portion of the specification describes in detail only one particular mode of practicing the invention. Those of skill in the art will appreciate that not all implementation details described below are necessary to practice the invention as recited in the claims. For example other methods for estimating wirelengths and bin density could be employed. The objective function could include other weighted factors related to other placement attributes such as, for example, routing congestion and power distribution.

The invention claimed is:

1. A computer-implemented method for specifying positions of a plurality of instances within an integrated circuit (IC) by converging total overflow ratio (TOFR), wherein TOFR indicates the degree of instance overlap and is based on the parameters comprising at least one of the area occupied by moveable instances and the area not occupied by pre-placed instances that is available for accommodating moveable instances, the method comprising using a computer to perform the steps of:
   a. defining a hierarchy of blocks, wherein a parent block residing at the next higher level of the hierarchy comprises a plurality of component block instances or cell instances residing at current level of the hierarchy;
   b. for each hierarchy level from the highest level to the lowest level one by one, generating a placement within the hierarchy level, further comprising the steps of:
      b1. assigning the initial position of each instance residing at the hierarchy level according to the position of its respective parent block, or by assigning the initial position of each instance to a pre-determined position if the hierarchy level is the highest level;
      b2. providing an initial objective function;
      b3. iteratively determining the new positions for a plurality of moveable instances according to the current positions of the instances and the directions taken by the gradient of the objective function until the cost of the objective function ceases to decrease;
      b4. modifying the objective function according to TOFR if TOFR is not converged to a pre-defined range for the hierarchy level; and
      b5. repeating step b3 and step b4 until TOFR is converged to the pre-defined range for the hierarchy level.

2. The computer-implemented method in accordance with claim 1,
   wherein the IC is divided into a plurality of bins, and the objective function comprises weighted wirelength and bin density terms, wherein the wirelength term is a function of estimated total wirelength of the nets, and the density term is a function of instance density in each bin.

3. The computer-implemented method in accordance with claim 2,
   wherein a maximum amount of available space $M_b$ is specified within each bin b for accommodating instances, wherein the density term is a function of a difference between areas of instances within each bin b and the specified maximum amount of available space $M_b$ for each bin b.

4. The computer-implemented method in accordance with claim 3, wherein the objective function is modified at step b4 by altering relative weighting of its wirelength and bin density terms.

5. The computer-implemented method in accordance with claim 1, wherein step b3 comprises the substeps of:
   b31. determining the direction of each moveable instance; and
   b32. determining the step size of each moveable instance; wherein the step size is dynamically adjusted until the objective function ceases to decrease.

6. The computer-implemented method in accordance with claim 1, wherein step b further comprises the steps of:
   b6. if the hierarchy level is the lowest hierarchy level, look-ahead legalizing the positions of instances and computing the total wire length based on the legalized positions;

b7. if the hierarchy level is the lowest hierarchy level, modifying the objective function according to the total wire length and going back to step b3 until the total wire length ceases to decrease.

7. The computer-implemented method in accordance with claim 2, wherein at least one of the instances is a preplaced instance that is constrained to be placed at a particular location within the IC and all other instances are moveable instances each of which may be placed at any of a variety of locations within the IC, and IC is defined as being divided into a plurality of bins, wherein each bin is determined to have at least the specified amount of unoccupied space by computing an overflow ratio (OFR) for that bin and determining the total overflow ratio (TOFR) of all bins is higher than a predetermined minimum value, wherein the OFR of bin b is defined as:

OFRb=max (0, Occupied_Area−Available_Area)/Available_Area) and TOFR for all bins is defined as:

$$TOFR = \sum_b OFR_b \text{ for all bins,}$$

wherein (Occupied Area) is a total area of portions of moveable instances within the bin and the (Available Area) is the area of the bin not occupied by preplaced instances.

8. The computer-implemented method in accordance with claim 2, wherein the weighting of the wirelength and bin density terms is initialized such that the wirelength term has a greater influence on the objective function value than the bin density term.

9. The computer-implemented method in accordance with claim 2, wherein the objective function is:

$$f(x, y) = \lambda_1 W(x, y) + \lambda_2 \sum_b (D'_b(x, y) - M_b)^2,$$

, wherein $\lambda_1$ and $\lambda_2$ are weighting factors, W(x, y) is the total wirelength term, $$D'_b(x, y) = \sum_{v \in V} c_v p_x(b, v) p_y(b, v)$$

$$p_x(b, v) = \begin{cases} 1 - ad_x^2, & 0 \le d_x \le w_v/2 + w_b \\ b(d_x - w_v/2 - 2w_b)^2, & w_v/2 + w_b \le d_x \le w_v/2 + 2w_b \\ 0, & w_v/2 + 2w_b \le d_x, \end{cases}$$

$a=4/((w_v+2w_b)(w_v+4w_b))$, $b=2/(w_b(w_v+4w_b))$, $d_x$, $d_y$ are orthogonal x and y direction distances between a center of instance v and a center of bin, $W_b$ is a width of bin b,
$w_v$ is a width of instance v, and
$c_v$ is a constant for each instance v.

10. The computer-implemented method in accordance with claim 9, wherein the total wirelength W(x, y) of all nets e of the set E of all nets interconnecting instances k positioned at coordinates $(x_k, y_k)$ is determined in accordance with $$W(x, y) = \gamma \sum_{e \in E} \begin{pmatrix} \log \sum_{v_k \in e} \exp(x_k/\gamma) + \log \sum_{v_k \in e} \exp(-x_k/\gamma) + \\ \log \sum_{v_k \in e} \exp(y_k/\gamma) + \log \sum_{v_k \in e} \exp(-y_k/\gamma) \end{pmatrix},$$

where $\gamma$ is a constant.

11. The computer-implemented method in accordance with claim 9, wherein total wirelength W(x, y) of all nets e of the set E of all nets interconnecting instances k positioned at coordinates $(x_k, y_k)$ is determined in accordance with:

$$W(x, y) = \sum_{e \in E} \left( \left( \sum_{v_k \in e} (x_k)^p \right)^{\frac{1}{p}} - M_x + \left( \sum_{v_k \in e} (M_x - x_k)^p \right)^{\frac{1}{p}} + \left( \sum_{v_k \in e} (y_i)^p \right)^{\frac{1}{p}} - M_y + \left( \sum_{v_k \in e} (M_y - y_i)^p \right)^{\frac{1}{p}} \right),$$

wherein p is a constant, wherein each instance k has coordinates $x_k > 0$ and $y_k > 0$, wherein $M_x$ is a constant larger than max $(x_k)$ for all instances k, and wherein $M_y$ is a constant larger than max $(y_k)$ for all instances k.

12. The computer-implemented method in accordance with claim 6, wherein a portion of the plurality of instances with larger size is first look-ahead legalized.

13. The computer-implemented method in accordance with claim 5, wherein the step size $\alpha_i$ that instances are to be moved is determined at step b32 in accordance with the expression $\alpha_i = s/\|d_i\|^2$, wherein s is a constant and $d_i$ is a direction vector indicating the determined directions in which the instance positions are to be moved.

14. The computer-implemented method in accordance with claim 13, wherein $d_i = B_i d_{i-1} - f'(x_i)$, wherein $B_i = \Delta x_i^T (\Delta x_i - \Delta x_{i-1})/\Delta x_{i-1}^T \Delta x_{i-1}$ and $f'(x_i)$ is a derivative of the objective function.

15. The computer-implemented method in accordance with claim 1, wherein modifying the objective function at step b4 is performed by increasing the effect of density term relative to wirelength term in the objective function.

16. A non-transitory computer readable media encoded with computer executable instructions to perform a computer-implemented method of claim 1.

* * * * *